United States Patent [19]

Hale

[11] 4,018,631
[45] Apr. 19, 1977

[54] COATED CEMENTED CARBIDE PRODUCT
[75] Inventor: Thomas E. Hale, Warren, Mich.
[73] Assignee: General Electric Company, Schenectady, N.Y.
[22] Filed: June 12, 1975
[21] Appl. No.: 586,479
[52] U.S. Cl. .............................. 148/31.5; 428/538; 148/16.5; 148/16.6; 148/32; 427/249; 427/343; 427/377; 427/379; 427/4.9 F; 428/469; 428/472
[51] Int. Cl. .................... C22c 14/00; C22c 16/00; C22c 27/02; C22c 27/04
[58] Field of Search .......... 427/343, 377, 228, 249, 427/379, 419; 428/469, 472; 148/31.5, 16.5, 16.6; 29/182.7

[56] References Cited
UNITED STATES PATENTS

| | | | |
|---|---|---|---|
| 3,656,995 | 4/1972 | Reedy | 427/249 |
| 3,771,976 | 11/1973 | Wakefield | 427/249 |
| 3,772,058 | 11/1973 | Bloom | 427/249 |
| 3,784,402 | 1/1974 | Reedy | 427/249 |
| 3,791,847 | 2/1974 | Araki et al. | 427/228 |
| 3,807,008 | 4/1974 | Reedy | 427/249 |

Primary Examiner—Ronald H. Smith
Assistant Examiner—Janyce A. Bell

[57] ABSTRACT

Improved adherence of oxide coatings on cemented carbide substrate containing tungsten and cobalt is attained by forming on the substrate a coating selected from carbide, nitride, carbonitride and mixtures thereof, diffusing tungsten and cobalt from the substrate into the coating, oxidizing said coating, and coating said oxidized coating with oxide wear layer.

7 Claims, No Drawings

COATED CEMENTED CARBIDE PRODUCT

This invention relates to coated cemented carbide products. More particularly, it relates to such coated cemented carbide products in which the aluminum oxide or other oxide wear layer is more firmly bonded to the substrate. The present cemented carbides contain tungsten as a carbide former and may contain as well transitional carbides of one or more of the metals of Groups IVb, Vb, VIb of the Periodic Table. The carbide or mixed carbides are cemented or bonded together by matrix metals including cobalt, which matrix can also include iron or nickel or both of these metals. A typical cemented carbide contains tungsten carbide in a cobalt matrix.

While the coating of cemented carbides with oxides to even further increase their already well-known wear resistance is in itself well known as evidenced by U.S. Pat. Nos. 3,736,107 and 3,836,392, it has become apparent that proper steps must be taken to adequately bond the oxide layer to the cemented carbide substrate if the superior wear resistance of the oxide layer is to be realized, and it is a primary object of this invention to provide means for enhancing the adherence of oxide wear layers to cemented carbide substrates.

It has further been found that a selective pretreatment of cemented carbides before application of the oxide wear layer unexpectedly enhances and improves the adherence of the subsequently applied oxide wear layer to the cemented carbide substrate. More specifically, it has been found that such adherence is unexpectedly improved by treating the tungsten and cobalt containing substrate in a first atmosphere to form on the cemented carbide substrate a coating of carbide, nitride or carbonitride or mixtures thereof from titanium, tantalum, hafnium, zirconium, niobium and mixtures thereof. The so-coated substrate is treated in a second nonreactive atmosphere such as a vacuum, argon, hydrogen and the like at a temperature higher than the melting point of the cobalt matrix phase or over about 1300° C and preferably from about 1300° to 1500° C, preferably for at least 5 minutes, and from a practical point of view up to about 60 minutes or even longer to diffuse tungsten and cobalt from the substrate into the coating formed thereon. Generally speaking, times over about 60 minutes are not necessary although they may be used. The resulting product is then fired in an oxidizing atmosphere to oxidize the carbide, nitride or carbonitride or mixtures of enriching metal such as titanium, tantalum, hafnium, zirconium, niobium or mixtures thereof, care being taken not to oxidize the tungsten carbide and cobalt phases of the substrate. It will be realized that the oxidizing reaction is of a time-temperature nature and that generally, lower temperatures can be utilized for longer times and higher temperatures for short times to form an oxide, oxycarbide or oxynitride layer. Convenient temperatures range from 800° to 1400° C and the time of treatment at least about 5 minutes. It has been found that the resulting tightly adherent substrate surface layer of oxide, oxycarbide or oxynitride of titanium, tantalum, hafnium, zirconium or niobium or mixtures thereof so formed admirably serves as a receptive surface for the subsequently deposited aluminum oxide or other oxide wear layer. The present invention is particularly useful in that it can be used to surface treat cemented carbide substrates which originally have no titanium carbide or tantalum carbide content. It is, howesver, useful also for substrates which contain these metals along with tungsten.

The treatment of cemented carbide substrates with carbide, nitride- and carbonitride-forming atmospheres to form metallic carbides, nitrides and carbonitrides and mixtures thereof is well known, being described, for example, in U.S. Pat. No. 3,854,991 which is included herein by reference. In this patent there are described various atmospheres ranging from, by volume, 23.5 to 98 percent hydrogen, 0 to 75 percent nitrogen, 0 to 2 percent methane, and about 1 percent of chloride, such as of hafnium and zirconium for which can be substituted the corresponding chloride of tantalum and titanium, the substrate being typically heated at from about 1000° C to 1300° C in the particular atmosphere desired. Other suitable treating atmospheres of varying proportions of constituents will occur to those skilled in the art. Likewise, other well known deposition techniques can be used such as physical vapor deposition, sputtering and pack diffusion.

Those features of the invention which are believed to be novel are set forth with particularity in the claims appended hereto. The invention will, however, be better understood from a consideration of the following description.

EXAMPLE 1

Cutting inserts of cemented carbide containing by weight about 8 percent titanium carbide, 11.5 percent tantalum carbide, 8.5 percent cobalt, with the balance tungsten carbide and inserts of cemented carbide containing 12.5 percent titanium carbide, 12 percent tantalum carbide, 4.5 percent cobalt, with the balance tungsten, were coated with a 2–3 micron thick layer of titanium carbide by exposing the inserts to an atmosphere containing, by volume, 94 percent hydrogen, 4 percent methane, and 2 percent titanium tetrachloride, at a temperature of 1050° C to 1100° C for about 20 minutes. The inserts so coated were fired for about 30 minutes at 1400° C in a vacuum, such treatment serving to diffuse tungsten and cobalt into the coating as evidenced by subsequent examination of the coating. The so treated coating was then oxidized by firing or heating for 15 minutes at 1100° C in a hydrogen atmosphere containing 20 percent by volume of carbon dioxide, such as atmosphere forming the well known water gas reaction products, water and carbon monoxide. An aluminum oxide layer was then deposited on the so treated coating in the manner described in U.S. Pat. No. 3,736,107 by exposing the insert for 1 hour at 1100° C to an atmosphere of hydrogen containing, by volume, 20 percent carbon dioxide and about 5 percent aluminum trichloride. For comparison purposes, inserts of the above cemented carbide inserts were coated with alpha aluminum oxide without the surface enrichment and oxidizing pretreatment of the present invention, both sets of inserts being then tested for adherence of the aluminum oxide coating to the substrate. Such adherence was tested by scribing the aluminum oxide wear coating with a diamond Rockwell hardness indentor using increasing degrees of loading until spalling or failure of the oxide coating occurred. It was found that cemented carbides coated with aluminum oxide without the pretreatment of the present invention could withstand loads of only about 1 to 2 kilograms without spalling or separating from the substrate. On the other hand, the pretreated and aluminum oxide coated inserts of the present invention withstood loads of about 4–5 kilograms without spalling or failure of the coating. Examination of the microstructure of cross sections of the above coated inserts showed about a 4–6 micron aluminum oxide layer over a continuous 2 to 3 micron continuous titanium oxide or oxycarbide layer in the case of the inserts of the present invention which were precoated and fired before aluminum oxide deposition. Inserts prepared according to the prior art method without the present pretreatment showed only slight amounts of an oxide interlayer phase which was probably formed by oxidation of the titanium carbide and tantalum carbide solid solution phase present in the substrate. This phase was further present only in a discontinuous manner between the aluminum oxide wear layer and the cemented carbide substrate.

EXAMPLE 2

Inserts of cemented carbide containing by weight 6 percent cobalt with the remainder tungsten carbide were precoated in the manner of Example 1 with a titanium carbide layer about 2–3 microns thick, the so pretreated inserts being then fired for 30 minutes at 1400° C in a vacuum and fired for 15 minutes at 1100° C in an atmosphere of hydrogen with 20 percent by volume $CO_2$, and then coated with aluminum oxide as in Example 1. The pretreated inserts withstood under the above Rockwell diamond indentor scribing test a load of about 4 kilograms before spalling. On the other hand, when aluminum oxide was directly coated on the cemented carbide substrate in the manner of the prior art as described above, the wear layer spalled under only about a one-kilogram load.

EXAMPLE 3

Inserts of cemented carbides of all of the above types were coated with titanium carbide overlayers ranging in thickness from about 1 to 5 microns by the method described in Example 1. These inserts were then directly coated with aluminum oxide with no diffusion firing treatment and no oxidizing pretreatment. It was found that the strength of the bond between the aluminum oxide coating and the titanium carbide coated substrate was very poor, being unable to withstand 2 kilogram loadings using the scribe test described above. This example makes clear that the diffusion firing treatment of the present invention wherein the preliminary coated cemented carbide is fired in a nonreactive atmosphere to permit diffusion of tungsten and cobalt into the coating followed by oxidation is a necessary procedure if the unexpectedly enhanced adherence characteristics of the present invention are to be achieved.

EXAMPLE 4

Inserts of cemented carbide containing by weight about 12.5 percent titanium carbide, 12 percent tantalum carbide, 4.5 percent cobalt with the balance tungsten carbide were precoated with titanium carbide layers from about 3 to 5 micron thickness in the manner of Example 1 and then subjected directly without diffusion treatment in a nonreactive atmosphere to an oxidizing pretreatment at 1100° C for about 15 minutes to convert the titanium carbide coating to an oxide containing phase. Such inserts, when subsequently coated with aluminum oxide as described above, were found to resist loadings of no better than about 1–2 kilograms in the above scribe test before firing or spalling. This example points out the necessity of the present diffusion treatment and the oxidation alone is insufficient for the purpose of this invention.

EXAMPLE 5

Inserts of cemented carbide containing by weight 6 percent cobalt as a matrix with the remainder tungsten carbide were coated with about 3–5 micron thick layers of titanium carbide in the manner of Example 1, and treated for about 2½ hours at 1250° C in a vacuum rather than at 1300° C or above. The inserts were then given the oxidizing pretreatment of Example 1 for 15 minutes at 1100° C and subsequently aluminum oxide coated again as in Example 1. When tested using the above scribe test, it was found that the bond strength of the aluminum oxide to the substrate was poor, the coating being able to withstand no more than about a 2-kilogram load.

It will be seen from the above that the adherence of oxide wear layers such as of alpha aluminum oxide to cemented carbide substrates is much improved by the pretreatment of the present invention. As pointed out above, the present invention is applicable to a wide range of cemented carbide compositions and is also useful in treating cemented carbides which have no titanium or tantalum content. While interlayers of certain thicknesses were obtained in the above examples, it will be realized that much thinner and even non-continuous layers down to layers of mono-molecular thickness are useful.

What I claim as new and desire to secure by Letters Patent of the United States is:

1. The process of pretreating cemented carbide substrate containing tungsten and cobalt for the reception of wear resistant oxide coatings which comprises
   a. treating the substrate in a first atmosphere selected from carbide, nitride and carbonitride forming atmospheres to form the corresponding coating of metal selected from titanium, tantalum, hafnium, zirconium, niobium and mixtures thereof on the substrate,
   b. firing the coated substrate in a second, nonreactive, atmosphere at a temperature greater than the melting point of the cobalt phase to diffuse tungsten and cobalt into said coating, and
   c. heating the product of (b) in a third, oxidizing, atmosphere to oxidize said coating.

2. The process of claim 1 wherein the temperature of treatment in said nonreactive atmosphere is over about 1300° C.

3. The process of claim 1 wherein the temperature of treatment in said nonreactive atmosphere ranges from about 1300° to 1500° C.

4. A process as in claim 1 wherein an oxide wear coating is superimposed on the pretreated cemented carbide substrate.

5. The product of claim 1.

6. The product of claim 4.

7. The process of treating cemented carbide substrate containing tungsten and cobalt to improve wear resistance which comprises
   a. forming on said substrate a coating comprising a material selected from carbide, nitride, carbonitride and mixtures thereof of metal selected from titanium, tantalum, hafnium, zirconium, niobium and mixtures thereof,
   b. diffusing tungsten and cobalt into said coating,
   c. oxidizing said coating, and
   d. Coating said oxidized coating with an oxide wear layer.

* * * * *